United States Patent
Khan et al.

(10) Patent No.: US 6,553,552 B1
(45) Date of Patent: Apr. 22, 2003

(54) METHOD OF DESIGNING AN INTEGRATED CIRCUIT MEMORY ARCHITECTURE

(75) Inventors: Emdadur R. Khan, San Jose, CA (US); Todd W. Richmond, Ft. Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/491,650

(22) Filed: Jan. 27, 2000

(51) Int. Cl.$^7$ .............................. G06F 17/50; G11C 8/00
(52) U.S. Cl. ............................... 716/10; 716/11; 716/2; 365/230.03
(58) Field of Search ................................. 716/10–14, 2, 716/7–9; 365/230.03, 230.06, 51, 52, 63, 205, 230.01

(56) References Cited

U.S. PATENT DOCUMENTS

| | | | |
|---|---|---|---|
| 4,899,308 A | | 2/1990 | Khan .......................... 365/104 |
| 5,877,780 A | * | 3/1999 | Lu et al. ...................... 345/519 |
| 5,883,814 A | * | 3/1999 | Luk et al. ....................... 716/2 |
| 6,230,235 B1 | * | 5/2001 | Lu et al. ...................... 711/106 |

OTHER PUBLICATIONS

Gokhale et al, "Automatic Allocation of Arrays to Memories in FPGA Processors With Multiple Memory Banks," IEEE, Apr. 1999, pp. 1–7.*
Barua et al, "Memory Bank Disambiguation Using Modulo Unrolling for Raw Machines," IEEE, Dec. 1998, pp. 1–10.*
Panda et al, "Memory Bank Customization and Assignement in Behavioral Synthesis," IEEE, Nov. 1999, pp. 477–481.*
J. Kneip, "An Object–Oriented Data Cache Archictecture for Programmable Parallel Digital Signal Processors," IEEE, Dec. 1997, pp. 105–112.*
IBM Technical Disclosure Bulletin, vol. 33, No. 6B, Nov. 1990, pp. 24–26.
IBM Technical Disclosure Bulletin, vol. 33, No. 3A, Aug. 1990, pp. 379 and 380.
ISSCC 93/Session 16, Static Memories/Paper FA 16.4, "A 9ns 16Mb CMOS SRAM with Offset Reduced Current Sense Amplifier", 1993 IEEE International Solid–State Circuits Conference, Digest of Technical Papers, pp. 248, 249 and 297.
ISSCC 95/Session 7, Flash Memory, Paper TA 7.6, "A 35ns–Cycle–Time 3.3V–Only 32Mb NAND Flash EEPROM", 1995 IEEE International Solid–State Circuits Conference, Digest of Technical Papers, pp. 130, 131 and 351.
Mentor Graphics, "Technology Independent Design Environment" (TIDE), Jan. 30, 1997, pp. 1–39 and 1–8.

* cited by examiner

Primary Examiner—Vuthe Siek
(74) Attorney, Agent, or Firm—Stallman & Pollock LLP

(57) ABSTRACT

A method for generating a memory of various sizes and configurations uses a plurality of banks. The banks are selected to meet memory requirements and size constraints and are arranged in an orthogonal array. Critical paths are minimized using commercially available software.

7 Claims, 8 Drawing Sheets

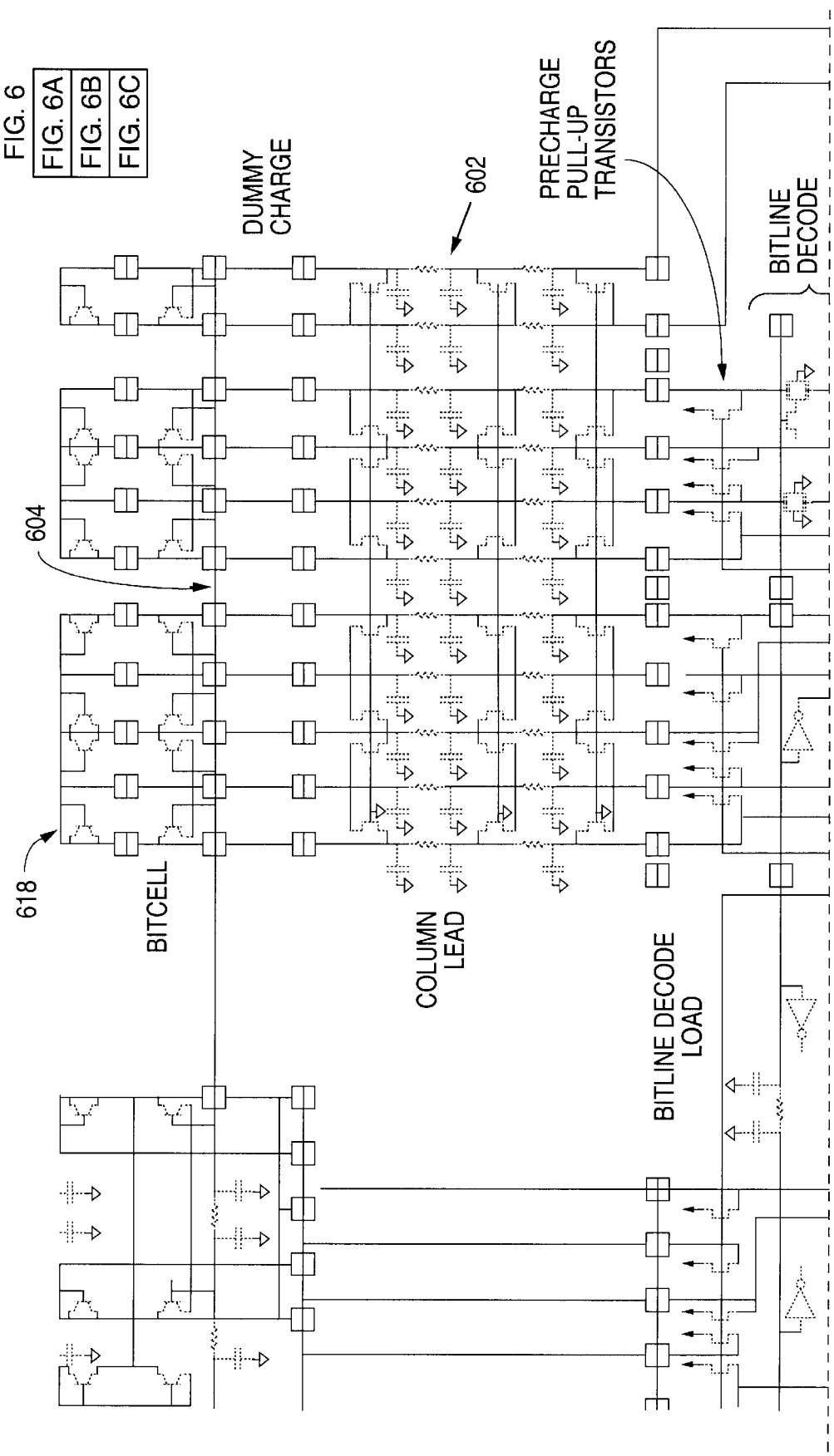

METHOD OF DESIGNING AN INTEGRATED CIRCUIT MEMORY ARCHITECTURE

FIELD OF THE INVENTION

The invention relates generally to the design of memories and more specifically to the computer-based design of memories of various size and configurations.

BACKGROUND OF THE INVENTION

With today's sub-micron CMOS technology, it is possible to put millions of transistors on a single chip. This has made the realization of systems on a chip (SOC) possible, but has also significantly increased the complexity of VLSI design. Design automation has become very important to efficiently manage SOC realizations. As most SOCs need various types of memories, the need for generator- (or compiler-) based memories is rapidly growing to reduce time to market, development cost and improve reliability.

Many SOCs also require large memories, often in the mega-bit range. Providers of application specific integrated circuit (ASIC) memory libraries are trying to address such mega-bit memory requirements by extending the upper capacity limit of their basic memory offerings. Usually, this approach suffers adversely in area, performance and power consumption. In general, merely scaling up an existing small capacity memory generator (e.g., 64 Kbit ROM) to a large capacity memory generator (e.g., 2 Mbit ROM) adversely affects memory performance.

More specifically, conventional approaches to generating a large capacity memory include interconnecting a plurality of complete memory blocks using software routing tools. In this approach, common signals (i.e. clock, address, data, etc.) are heavily loaded. This results in signal skews, upsets timing constraints and increases access time. Moreover, the software routing tools typically do not lead to regular, evenly spaced, routing. This causes differences in the timing characteristics in the different memory blocks. Minimizing such differences is a tedious iterative process which may or may not produce good results. In addition, such methods provide little flexibility in terms of layout configuration.

Accordingly, a memory generator is desired which provides good scaleability with a variety of configurations. The memory generator should operate to minimize area, maximize speed and minimize power consumption. Moreover, a memory generator which produces one functional model, and thus one timing model to fully characterize the memory is preferred to simplify design considerations.

SUMMARY OF THE INVENTION

In one preferred embodiment, a method of designing a memory for a system on a chip application begins with a required memory capacity and determinable physical boundaries. The method selects a plurality of memory banks wherein each bank has a height, a width and a memory capacity. The method tiles the plurality of memory banks. Adjacent banks have matching dimensions along a common boundary and address signals are routed between adjacent banks. The method designs control circuitry to operationally couple with the plurality of memory banks. The control circuitry is configured to generate addressing signals for selecting address locations from within the plurality of memory banks.

In another preferred embodiment, a memory for an SOC application includes a plurality of memory banks configured in an array of at least one column and at least one row. Each of the plurality of memory banks has a plurality of memory locations. The memory includes a row decoder operationally coupled with the plurality of memory banks. The memory also includes a column decoder operationally coupled with the plurality of memory banks. The row decoder and column decoder are configured to select respective ones of the plurality of memory banks.

In yet another preferred embodiment of the invention, a memory for use with a system on a chip includes a plurality of banks arrayed into a plurality of rows and a plurality of columns. Each bank has a plurality of memory locations. The memory includes a bank row decoder operationally coupled with the plurality of banks. The memory includes a bank column decoder operationally coupled with the plurality of banks. The bank row decoder and bank column decoder are configured to select a respective one of the plurality of banks. The memory also includes a plurality of address row decoders each operationally coupled with a respective one of the plurality of rows. Finally, the memory includes a plurality of address column decoders each operationally coupled with a respective one of the plurality of columns. The address row decoders and address column decoders are configured to select respective ones of the plurality of memory locations in one of the plurality of banks.

DETAILED DESCRIPTION

Figure 1:
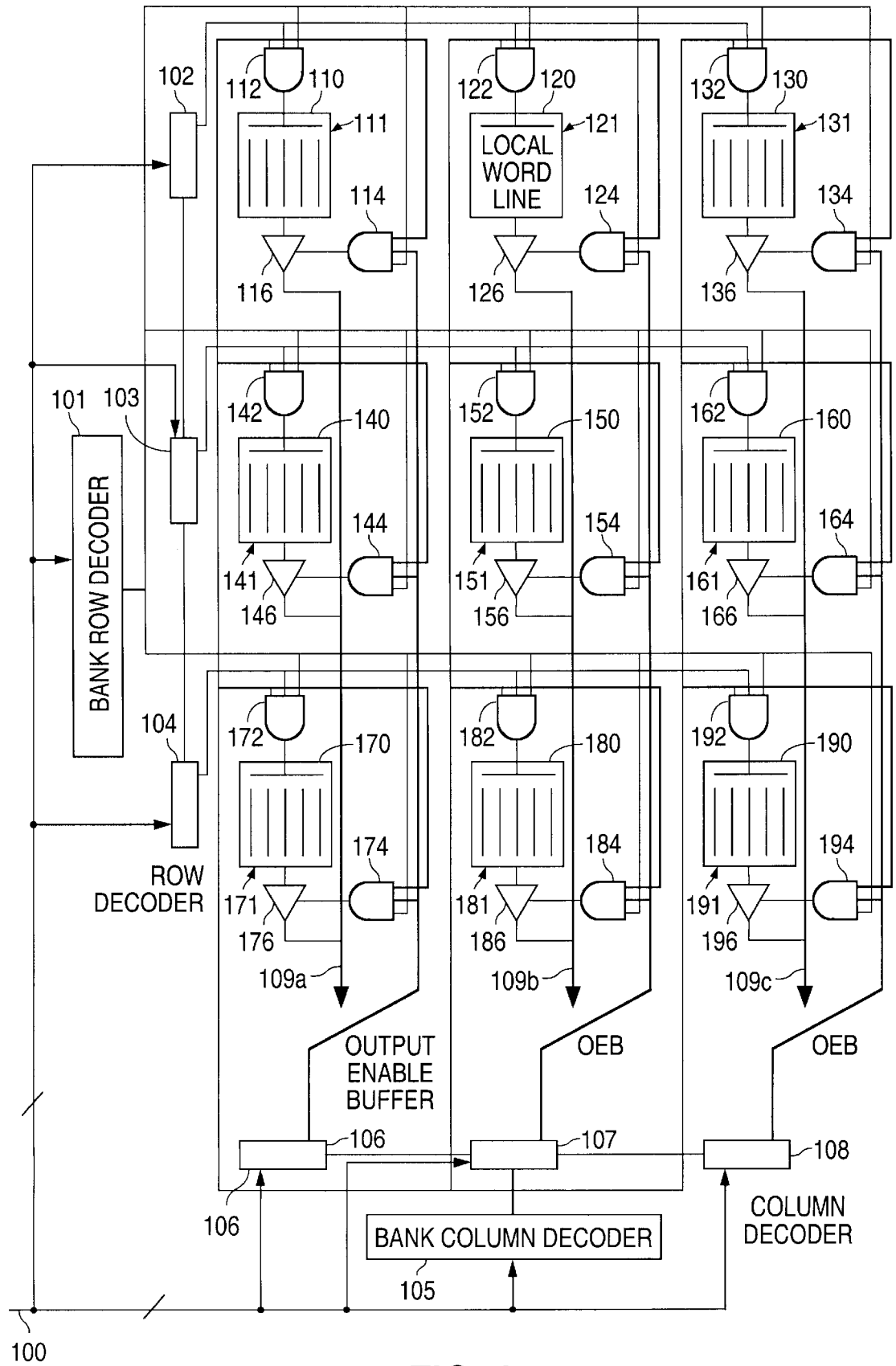
FIG. 1 is a block diagram of one preferred embodiment of a memory having a plurality of banks.

Turning to FIG. 1, one preferred embodiment of a memory having a plurality of banks is described. The memory is made up of several sub-blocks or memory banks 111, 121, 131, 141, 151, 161, 171, 181 and 191. Each bank includes a plurality of memory locations and related control circuitry, however, the individual banks do not include enough control circuitry to operate as a stand-alone memory. Instead, the banks are interconnected (or tiled) to form a larger memory. Additional control circuitry is provided to operate the memory. The control circuitry includes a bank row decoder 101, a bank column decoder 105, row decoders 102, 103 and 104, and column decoders 106, 107 and 108.

More specifically, bank 111 includes a memory bit cell 110, a source address selector 112, an output buffer 116 and bank control circuitry 114. Similarly, bank 121 includes a memory bit cell 120, a source address selector 122, an output buffer 126 and bank control circuitry 124; bank 131 includes a memory bit cell 130, a source address selector 132, an output buffer 136 and bank control circuitry 134; bank 141 includes a memory bit cell 140, a source address selector 142, an output buffer 146 and bank control circuitry 144; bank 151 includes a memory bit cell 150, a source address selector 152, an output buffer 156 and bank control circuitry 154; bank 161 includes a memory bit cell 160, a source address selector 162, an output buffer 166 and bank control circuitry 164; bank 17 1 includes a memory bit cell 170, a source address selector 172, an output buffer 176 and bank control circuitry 174; bank 181 includes a memory bit cell 180, a source address selector 182, an output buffer 186 and bank control circuitry 184; and bank 191 includes a memory bit cell 190, a source address selector 192, an output buffer 196 and bank control circuitry 194.

As shown, the banks are orthogonally arrayed to form three columns and three rows. Banks 111, 121 and 131 form a first row. Banks 141, 151 and 161 form a second row. Banks 171, 181 and 191 form a third row. Similarly, banks 111, 141 and 171 form a first column, banks 121, 151 and 181 form a second column, and banks 131, 161 and 191 form a third column.

Bank row decoder 101 connects to each of the banks. More specifically, bank row decoder 101 connects to the source address selector and bank control circuitry for each of the banks. These connections are used to select a memory bank and to enable its output. Similarly, bank column decoder 105 connects to the source address selector and bank control circuitry for each of the banks.

Each bank includes a plurality of memory locations. These memory locations may be selected by specifying an address row and address column within a particular bank. The address row and address column signals are provided by an address row decoder and an address column decoder. As shown, address row decoder 102 connects to the source address selector for each bank in the first row (i.e., address row decoder 102 connects to source address selectors 112, 122 and 132). Similarly, address row decoder 103 connects to the source address selector for each bank in the second row, and address row decoder 104 connects to the source address selector for each bank in the third row.

The address column decoder 106 connects to bank control circuitry for each bank in the first column (i.e., bank control circuitry 114, 144 and 174). Similarly, the address column decoder 107 connects to bank control circuitry for each bank in the second column (i.e., bank control circuitry 124, 154 and 184) and address column decoder 108 connects to bank control circuitry for each bank in the third column (i.e., bank control circuitry 134, 164 and 194).

To select a particular address location within the memory, an address bus 100 is connected to the bank row decoder 101, bank column decoder 105, address row decoders 102, 103 and 104, and address column decoders 106, 107 and 108. Based upon signals received from the address bus 100, the bank row decoder 101 generates a signal for selecting a bank row and the bank column decoder 105 generates a signal for selecting a bank column. Similarly, the address row decoders 102, 103 and 104 generate a signal for selecting an addressed row within a bank and the addressed column decoders 106, 107 and 108 generate a signal for selecting an addressed column within a bank.

Together, bank row decoder 101, bank column decoder 105, address row decoders 102, 103 and 104, and address column decoders 106, 107 and 108 operate to select one address location within the memory. During a read operation, data from the selected address location is provided over its respective data bus 109a, 109b, 109c.

Figure 2:
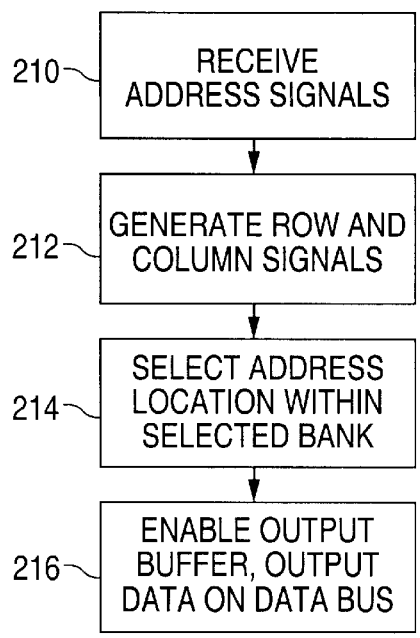
FIG. 2 is a flow chart showing the process of reading data from a memory location within the memory of FIG. 1.

The process for reading data from a memory location will now be described in further detail with reference to FIG. 2. At block 210, the process begins upon receiving a memory address over the address bus 100 (FIG. 1). These address signals are provided to bank row decoder 101, bank column decoder 105, address row decoders 102, 103 and 104, and address column decoders 106, 107 and 108.

For purposes of illustration, a memory address within bank 161 is selected. Accordingly at block 212, the bank row decoder 101 generates a signal operative to select row two and the bank column decoder 105 generates a signal operative to select column three. The address row decoder 103 and the address column decoder 108 generate signals operative to select an address location within bank 161.

The signals from bank row decoder 101, bank column decoder 105 and address row decoder 103 are provided to source address selector 162. Together, the signal lines conveying these signals are called a "local word line." The local word line selects a row of memory addresses within one bank. By gating the signals from bank row decoder 101 and bank column decoder 105, only one local word line will be generated. In this example, the local word line selects a row of memory addresses within bank 161. Of course, the contents of an entire row of memory addresses within the selected bank 161 cannot be provided simultaneously over the data bus 109c.

Accordingly at block 214, the signals from the bank row decoder 101, the bank column decoder 105, and the address column decoder 108 are provided to bank control circuitry 164. Since the address row decoder 103 has already selected a row of addresses within bank 161, bank control circuitry 164 uses the signal from the address column decoder 108 to select one address location from within such row of bank 161.

At block 216, the contents from the selected memory location are provided to output data buffer 166. Data buffer 166 is multiplexed with the other data buffers 136, 196 onto their data bus 109c so that only one bank provides data to the data bus 109c at a time. In a typical application, the data bus 109c connects to other components of an SOC.

In designing a memory for an SOC application, a particular memory size is often desired. In addition, depending upon the circuit layout, the application may require specific dimensions to minimize wasted space on a silicon wafer. For example an application may require a 1 Mb memory having a substantially square shape, alternatively an application may require a 1 Mb having a substantially rectangular shape with a particular ratio between the length and width. To meet the demands of a particular application, a plurality of banks are selected and interconnected to form a complete memory. The banks are selected to provide a sufficient number of memory locations and to meet any size constraints.

Figure 3:
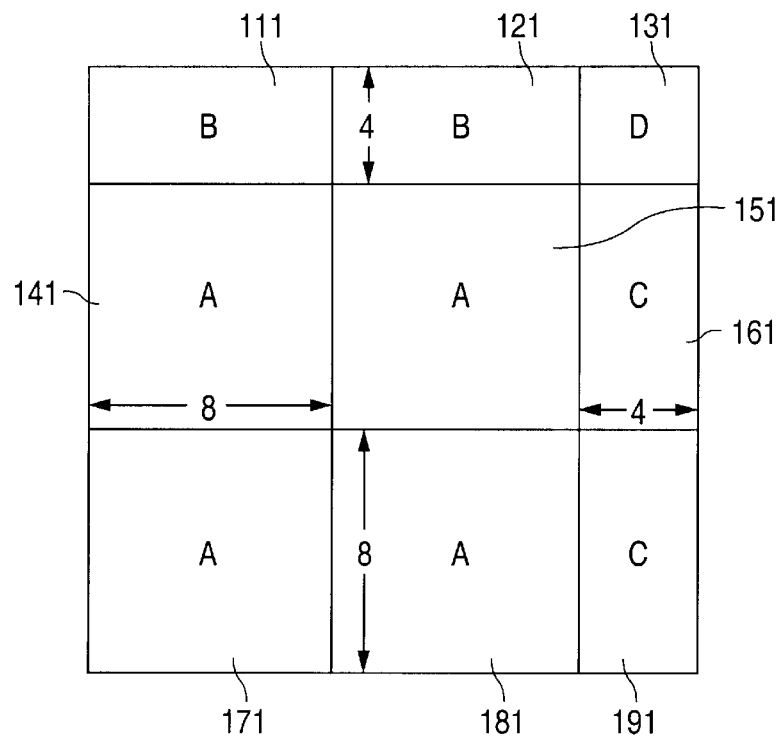
FIG. 3 is a block diagram of the memory of FIG. 1, showing the aspect relationships between the plurality of banks.

Turning to FIG. 3, the aspect ratios between the banks of FIG. 1 will be described. As shown, bank 141, bank 151, bank 171 and bank 181 are each of type A. The type A bank provides 64 Kb of memory. As mentioned above, the memory locations within the bank are partitioned by row and column. The type A bank provides 256 rows and 256 columns of memory locations. Banks 111 and 121 adjoin bank 141 and bank 151, respectively. Banks 111 and 121 are each of type B. The type B bank provides 32 Kb of memory. The type B bank provides 128 rows and 256 columns of memory locations. Banks 161 and 191 are each of type C.

The type C bank also provides 32Kb of memory. Unlike a type B bank, however, a type C bank provides 256 rows and 128 columns of memory locations. Finally, bank 131 is of type D. The type D bank provides 16 Kb of memory. The type D bank provides 128 rows and 128 columns of memory locations. Together banks 111, 121, 131, 141, 151, 161, 171, 181 and 191 provide 400 Kb of memory.

As may be noted from the forgoing description, the vertical dimension of each block matches that of adjoining blocks. More specifically, the number of rows in block 111 matches that of block 121; likewise the number of rows in block 121 matches that of block three 131. In other words, the vertical dimension is the same throughout a row.

Similarly, the horizontal dimension of each block matches that of adjoining blocks. More specifically, the number of columns in block 111 matches that of block 141; likewise the number of columns in block 141 matches that of block 171. In other words, the horizontal dimension is the same throughout a column.

Figure 4:
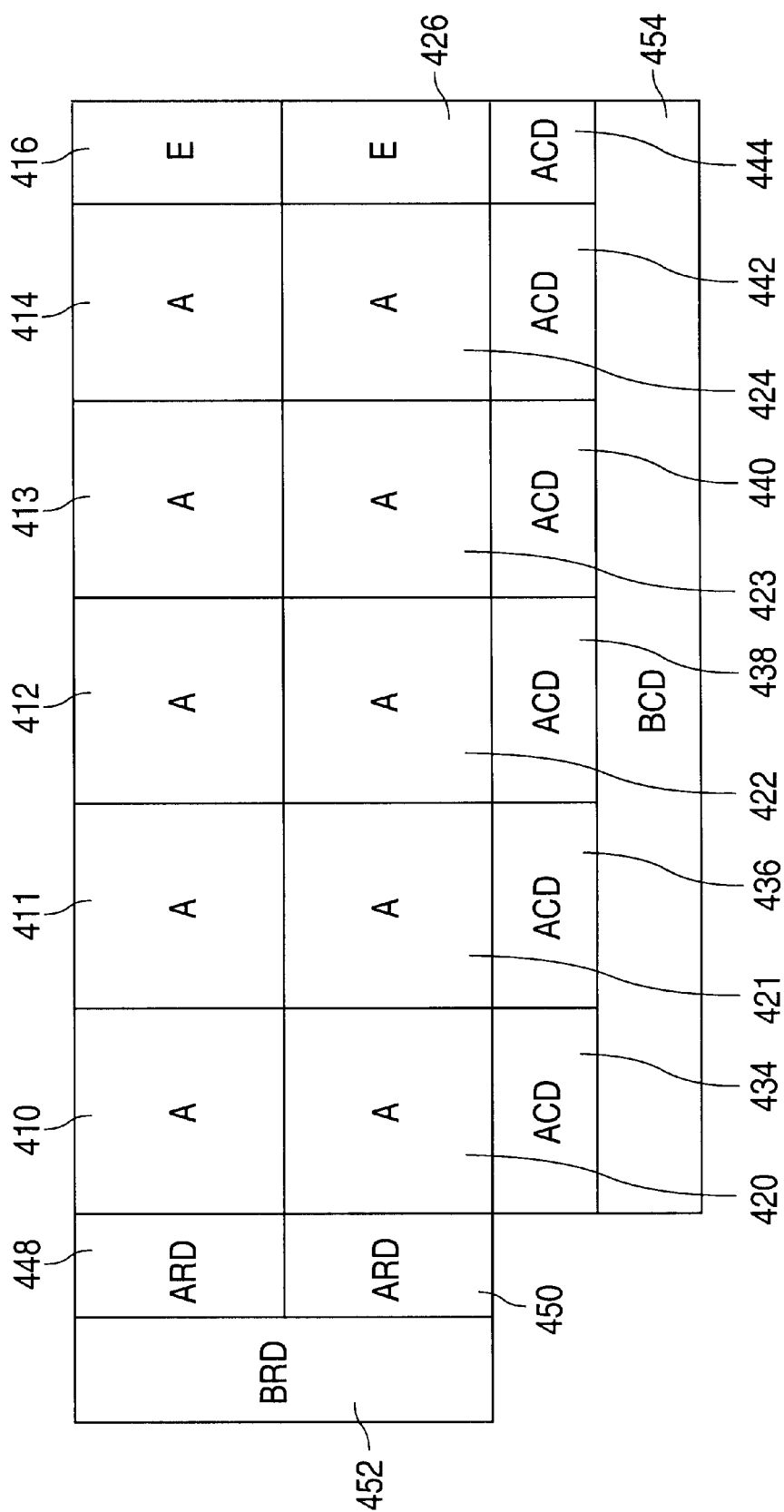
FIG. 4 is a block diagram of another preferred embodiment of a memory having a plurality of banks showing the aspect relationships between the plurality of banks.

Although the memory shown in FIG. 3 includes three columns and three rows of memory blocks, the number of columns and rows and their respective dimensions may be varied according to the requirements of an SOC. Turning to FIG. 4, another memory having multiple blocks and associated addressing hardware is described.

Banks 410–414 and 420–424 are each of type A. Banks 416 and 426 are of type E. A type E bank provides 16 Kb of memory. The type E bank provides 256 rows and 64 columns. The memory also includes a bank row decoder ("BRD") 452 and a bank column decoder ("BCD") 454, as well as address row decoders ("ARD") 448 and 450, and address column decoders ("ACD") 434, 436, 438, 440, 442 and 444. These blocks provide the same functionality as those of FIG. 1.

As with the memory of FIG. 3, the vertical dimensions are the same throughout a row and the horizontal dimensions are the same throughout a column of memory blocks. By matching the horizontal and vertical dimensions of adjacent memory blocks, the address and data signals may be easily routed from one bank to the next. Turning back to FIG. 1, the signals from bank row decoder 101, and address row decoders 102, 103 and 104 are simply passed between adjacent banks along a row of memory banks. Similarly, the signals from bank column decoder 105 and address column decoders 106, 107 and 108 are simply passed between adjacent banks along a column of memory banks. Other signals, such as a clock, may be easily provided by passing the signal along each of the rows or each of the columns of memory banks.

One important advantage of the above described design involves the ability to determine accurately the memory characteristics, including timing characteristics. As described above, many conventional techniques involve scaling an existing memory to meet a particular set of design requirements. Conversely, the subject invention selects from a set of predefined memory banks, each of which have well-known characteristics. Moreover, the tiling of these banks produces a memory array which may be characterized easily based upon the well-known characteristics of the individual memory banks. More specifically, the dimension of a memory array may be easily determined by adding the dimensions of the individual memory banks and associated control circuitry. Similarly, the timing characteristics of the memory array may be determined easily based upon the timing characteristics of the individual memory banks and associated control circuitry. Thus, a memory array designed according to the present invention avoids many of the time consuming and difficult iterative procedures commonly associated with scaling memories.

Figure 5:
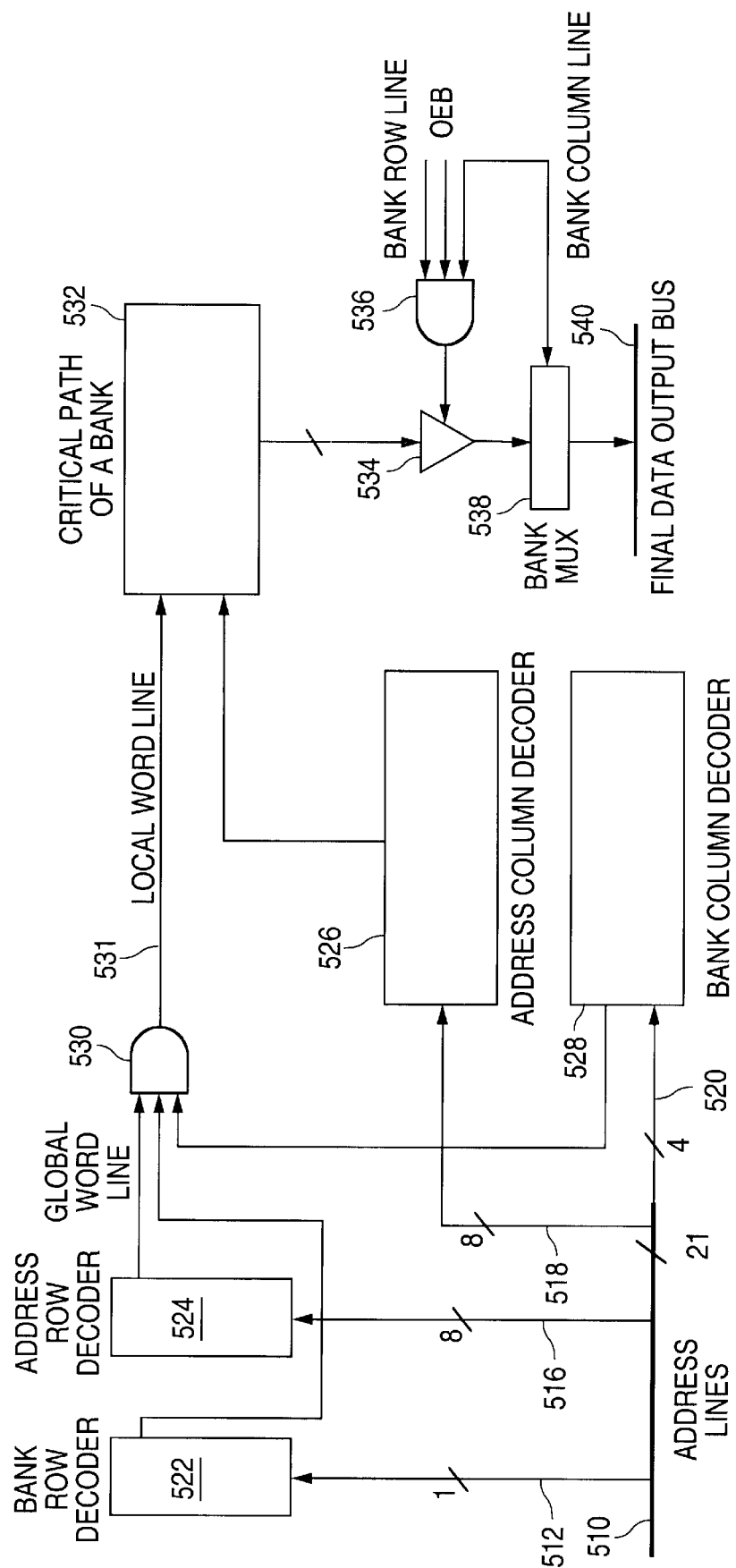
FIG. 5 is a circuit diagram of the critical paths of the memory of FIG. 1.

Turning to FIG. 5, the critical path of a 2 MBit ROM is described. The critical path defines the path of greatest delay, and is used to determine timing constraints. The ROM includes 32 memory banks configured in 2 rows and 16 columns. Each bank provides 64 Kb of memory so that the memory has a total of 2 Mb. An address within the space may be selected using address lines 510 which provide 21-bit addressing. One of the address lines 510 is connected to the bank row decoder 522 via a bank row decoder bus 512. Four of the address lines 510 are connected to column decoder 528 over column decoder bus 520.

The bank row decoder 522 receives address signals from the bank row decoder bus 512 and generates row selection signals. When the bank row decoder bus 512 is in a first state, the bank row decoder 522 selects a first row and when the bank row decoder bus 512 is in a second state, the bank row decoder 522 selects a second row.

Similarly, the bank column decoder 528 receives address signals from the bank column decoder bus 520 and generates column selection signals. As the bank column decoder bus 520 provides four lines, the bank column decoder bus 520 may select between 16 columns. The address row decoder 524 receives address signals from the address row decoder bus 516. Likewise the address column decoder 526 receives address signals from the address column decoder bus 518. Both the address row decoder bus 516 and the address column decoder bus 518 provide eight lines. Accordingly, the address row decoder 524 and the address column decoder 526 may select between 256 rows and columns, respectively.

Signals from the bank row decoder 522, the bank column decoder 528 and the address row decoder 524 are provided to the source address selector 530. Preferably, the source address selector is implemented using an AND gate or similar circuitry that provides such functionality. In response, the source address selector 530 generates a signal on the local word line 531 which is used to select a row of addresses in memory bank 532. Since bank 532 is selected from a predefined set of memory banks, its timing characteristics should be well defined.

Control circuitry 536 receives signals from the bank row decoder 522, the bank column decoder 528 and the address column decoder 526. In response, control circuitry 536 generates a control signal for selecting a particular memory location. This signal is provided to output buffer 534. Output buffer 534 provides the contents of the desired address location to multiplexor 538. Multiplexor 538 selects an input based upon a signal from the address column decoder 526 and provides that input to the data bus 540.

For purposes of determining the critical path, loads consist of both the transistor delays and interconnect delays. These delays are determined using π-modeling. Once the critical paths have been determined, various design parameters may be adjusted to minimize memory access time.

For a memory bank having significantly more columns than rows, the critical path for addressing a memory bank is from address bus 510, through bank column decoder 528, through source address selector 530 and through local word line 531. Hence optimization is performed on this path.

For a memory bank having significantly more rows than columns, the critical path for addressing a memory bank is from address bus 510, through bank row decoder 522, through source address selector 530 and through local word line 531. Hence optimization is performed on this path.

The critical path from a memory bank 532 to the data bus 540 consists of the control circuitry 536, the output buffer 534 and the multiplexor 538. Hence, optimization also is performed on this path.

In one preferred embodiment of the invention, commercially available software is used to design memory banks and related control circuitry. More specifically, Memory Builder software available from Mentor Graphics Corp., 8005 S.W. Boeckman Road, Wilsonville, Oreg. 97070 may be used. The memory banks are designed for implementation on a 0.25 micron process. Of course, other software and/or other processes may also be used.

Figure 6B:
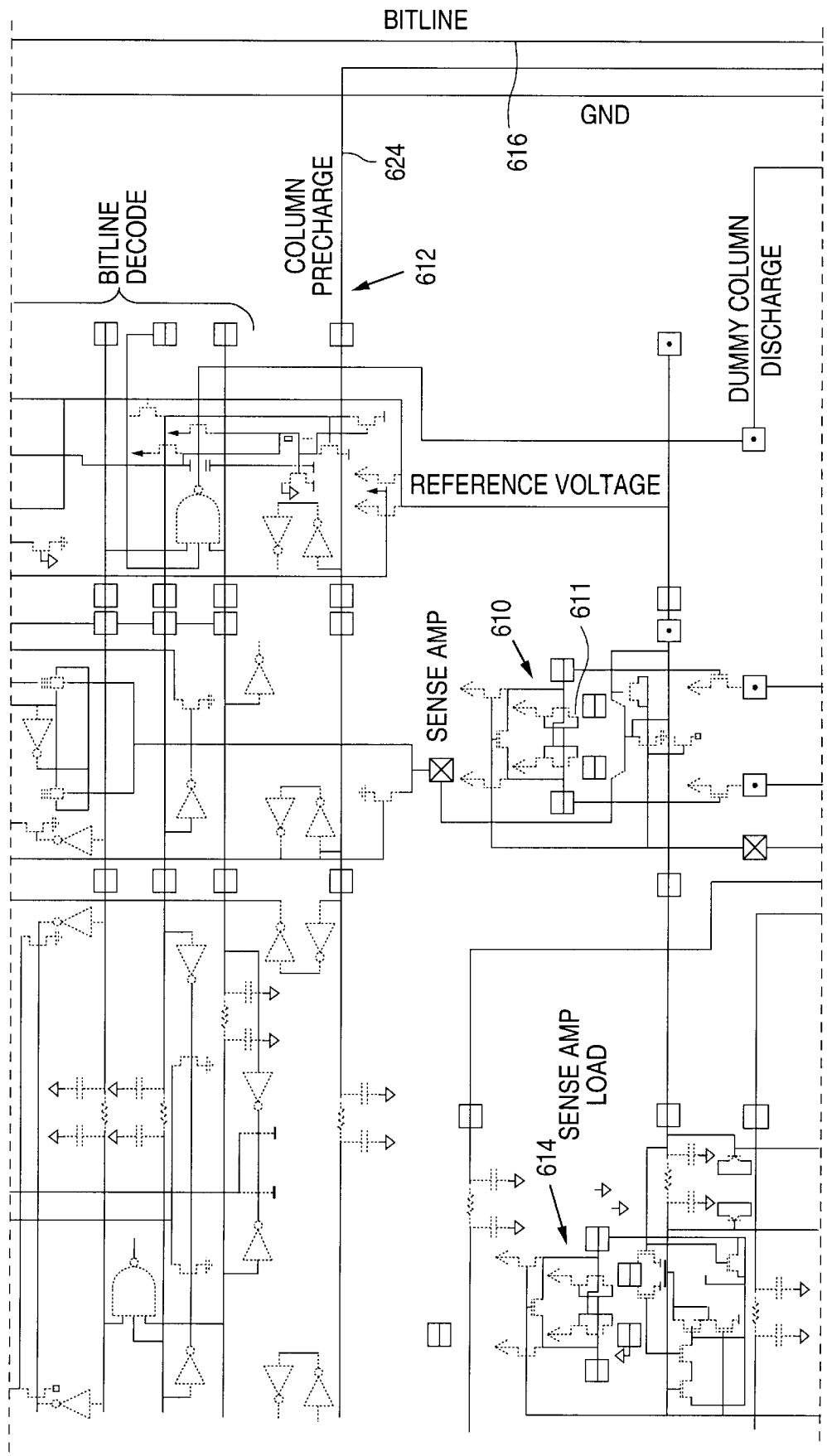
FIG. 6 is a partial circuit diagram of the memory and control circuitry for a bank generated using Technology Independent Development Environment (TIDE) software produced by Mentor Graphics.
Figure 6C:
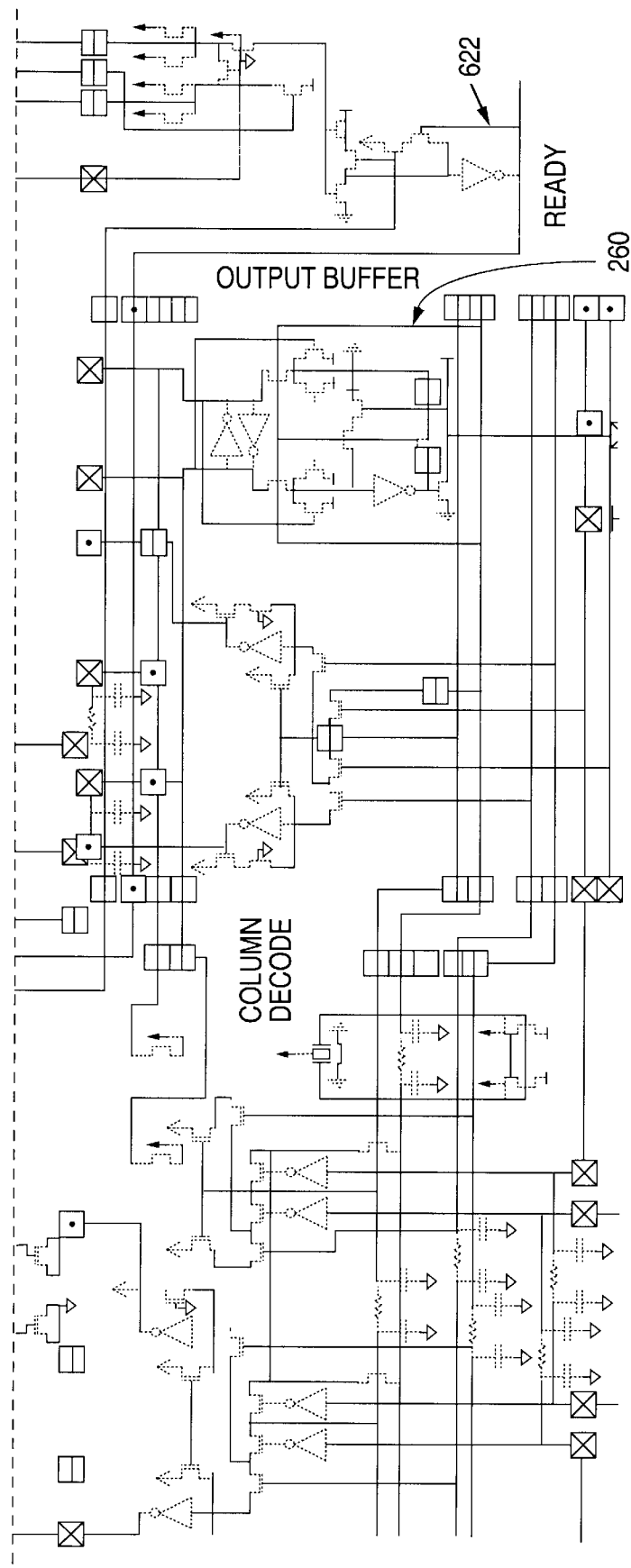

A critical portion of a preferred bank control circuit is detailed in the circuit diagram shown in FIG. 6. This circuit was designed using the above-mentioned software from Mentor Graphics. As will be explained in further detail, a self-timed circuit, cross-coupled inverters as the load in the source amplifier, precharged dynamic decoding and shared bit lines are the key features used to minimize area and reduce access time and power.

As shown, a self-timing scheme is implemented using a dummy column 602 and dummy row 604. An actual row is used as the dummy row 604 because different rows have different loads depending on the number of 1's and 0's programmed in each row. Self timer is activated at every read cycle after the address is applied and a word line is selected. Self timer includes dummy column 602, dummy row 604, dummy column discharge and column loads. The self timer triggers the sense amplifier 610, deactivates the word line and starts the precharge circuit 612. Self timer is carefully designed to ensure minimal access time for memory blocks ranging from the smallest to the largest size. This is accomplished by performing critical path simulations for all possible memory size and configurations.

Sense amplifier 610 is implemented using a differential pair 611 and uses cross-coupled inverters as a sense amplifier load 614. The differential pair 611 is enabled by an output signal (Sense-Enable) from self timer 606. The reference voltage used for sense amplifier 610 is designed to drop at half the rate as the voltage on the bit line 616 to ensure that the input to sense amplifier 610 quickly exceeds the threshold voltage for reading both 0's and 1's. This threshold voltage is 250 mv. The bit lines of the adjacent bit cells 618 are shared to minimize area. The reference voltage drop is self terminated when the reference voltage falls below Vdd–Vtn to ensure sufficient voltage to effectively trigger the sense amplifier 610. Vdd is the power supply voltage. Vtn is the threshold voltage of n-channel transistor. The output of the sense amplifier 610 is usually latched. So, the latched data is read when output buffer 620 is enabled. To ensure that only one bank drives the bus, the output of the output buffer is multiplexed with the other banks. The signals from the bank column decoder are used to control the multiplexor. This ensures that only one bank column may put data on a data bus 109 (shown in FIG. 1).

The critical path of the individual ROM bank shown in FIG. 6, was optimized by ensuring that the READY signal 622, which is controlled by self timer 606 occurs at the right time. The self timer 606 consists of the actual row selected and the dummy column 602. The READY signal 622 is generated when the dummy column 602 is fully discharged. The dummy column discharge path is enabled by a dummy column discharge signal which is activated for each selected bit line. The READY signal 622, in turn, is used to control signals on local word line 531 (shown in FIG. 5), column precharge 624 and sense-enable.

If READY signal 622 is generated too soon, then sense amplifier 610 will not have received data from the selected bit cell. If it occurs too late, the overall access time of the ROM will be unnecessarily delayed. Optimization of the READY signal 622 is done by manipulating the transistor sizes of the self-timer circuitry.

Once the generation of the READY signal 622 is optimized, the relative fall times of local word line 531 (shown in FIG. 5) and column precharge 624 must be adjusted since they are both generated by the READY signal 622. Local word line 531 must be turned off before the is column precharged, so it may be necessary to delay the signal on column precharge 624 with buffers. For the simulations run on the 2 Mb ROM shown in FIG. 6, it was necessary to delay the column precharge signal with several buffers.

Figure 7:
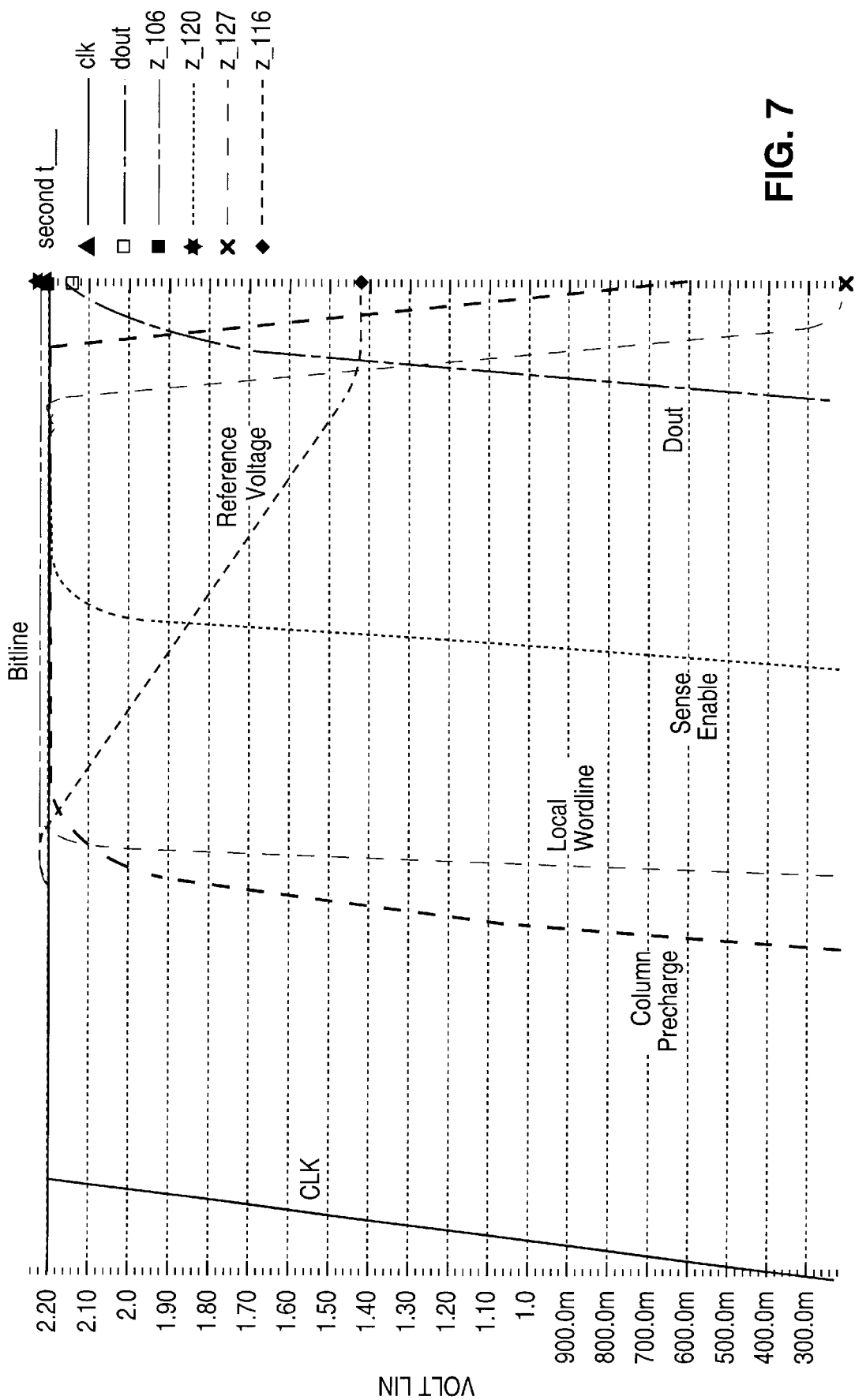
FIG. 7 is a timing diagram showing the relationships between selected signals in the circuit of FIG. 5.

Worst case timing simulations were run on the above-described circuit. The simulations were performed using slow-slow, 2.2v, 110 degrees Celsius, and 1pf output loads as the circuit parameters. The results are shown in the timing diagram of FIG. 7. In particular, the clock, column precharge, local word line, sense enable, and data out signals are shown. The total access time is 10 ns. This time includes 4 ns for the activation of local word lines, 3 ns to enable the sense amplifier, and 3 ns for signal propagation from the sense amplifier to the final data bus.

Figure 8:
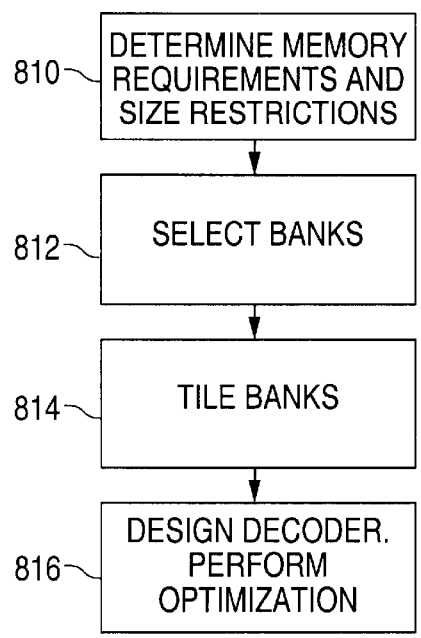
FIG. 8 is a flow chart showing one preferred process for designing a memory using a plurality of banks.

The process for designing a memory using the above-described banks will now be described with reference to FIG. 8. At block 810, a designer determines the memory requirements of the particular application. The memory requirements include determining the bit requirements of the application, as well as any physical size constraints. At block 812, the designer selects from a number of memory banks to meet the design requirements. For example, the banks shown in FIG. 3 could be selected where a 400 kb memory is needed.

At block 814, the memory blocks are tiled in an orthogonal array. Row and column decode lines are arranged as shown in FIG. 1 so that they may be shared among adjacent memory banks.

At block 816, appropriate address decoders are designed to provide the row and column decode signals. These decoders may be designed using Mentor Graphics TIDE or other commercially available memory generator software. The decoders are optimized so as to minimize delays along any critical paths.

The above-described tiling of different memory banks provides highly regular routing. Thus, a complete memory array can be characterized using this critical path analysis. Moreover, this approach requires less area since the row and column decode signals are shared among the memory banks. This also reduces routing area. Because of the use of a regular structure for tiling, the routing overhead is further minimized which also reduces area requirements. Smaller area reduces interconnects and can improve the speed. With this tiling approach, the routing is highly regular and thus one timing model and one functional model will suffice to fully characterize the memory array.

Although the embodiments described herein are with reference to memory banks having specific sizes, the present invention may be implemented using a variety of memory banks of any given size. In addition, although the embodiments described herein show specific circuit configurations other designs may perform the same functionality or obtain the same advantages using different configurations. Those having ordinary skill in the art will certainly understand

We claim:

1. A method of designing an integrated circuit memory architect wherein the memory architecture has a required memory capacity and determinable physical boundaries, the method comprising:

defining a set of individual memory bank designs such that each individual memory bank design has a set of characteristics that is different than the set of characteristics of other individual memory bank designs;

tiling selected individual memory bank designs to provide a memory array architecture comprising rows and columns of memory banks such that adjacent memory banks in the memory array architecture have matching dimensions along a common boundary and wherein address signals are routed between adjacent memory banks; and designing control circuitry to operationally couple with the memory banks, wherein the control circuitry is configured to generate addressing signals for selecting address locations from within the memory banks.

2. The method of claim 1 and wherein each of the set of characteristics of each individual memory bank designs includes a memory cell matrix design that includes a number of rows of individual memory cells and a number of columns of individual memory cells, the rows and columns of individual memory cells being orthogonally disposed, and wherein at least one of the number of rows and the number of columns of a memory cell matrix design is different than at least one of the number of rows and the number of columns of other memory cell matrix designs, and wherein the step of tiling comprises:

selecting individual memory bank designs such that each memory cell matrix design included in a row of the memory array architecture has the same number of rows of individual memory cells and such that each memory cell design included in a column of the memory array architecture has the same number of columns of individual memory cells.

3. The method of claim 2, and wherein the step of tiling further comprises selecting the individual memory bank designs such that a sum of the memory capacities of the individual memory bank designs exceeds the required memory capacity.

4. The method of claim 3, and wherein the step of tiling further comprises selecting the individual memory bank designs such that a sum of adjacent memory bank heights is less than a height of the determined physical boundary and the sum of the adjacent memory bank widths is less than a width of the determined physical boundary.

5. The method of claim 1, and wherein, in the step of tiling, row addressing signals are routed along common vertical boundaries of memory banks and column addressing signals are routed along common horizontal boundaries of memory banks.

6. The method of claim 1, and wherein, in the step of designing control circuitry, the addressing signals are configured to generate bank row and bank column select signals, wherein the bank row and bank column select signals identify respective ones of the memory banks.

7. The method of claim 6, and wherein, in the step of designing control circuitry, the addressing signals are further configured to generate address row and address column select signals, wherein the address row and address column select signals identify respective address locations within a selected memory bank.

* * * * *

UNITED STATES PATENT AND TRADEMARK OFFICE
CERTIFICATE OF CORRECTION

PATENT NO. : 6,553,552 B1
DATED : April 22, 2003
INVENTOR(S) : Emdadur R. Khan and Todd W. Richmond It is certified that error appears in the above-identified patent and that said Letters Patent is hereby corrected as shown below:

Column 9,
Line 7, please delete "architect" and insert -- architecture, --.

Signed and Sealed this

Nineteenth Day of August, 2003

JAMES E. ROGAN
*Director of the United States Patent and Trademark Office*